United States Patent
Cai et al.

(10) Patent No.: US 12,457,846 B2
(45) Date of Patent: Oct. 28, 2025

(54) DISPLAY PANEL AND DISPLAY DEVICE

(71) Applicant: Hubei Yangtze Industrial Innovation Center of Advanced Display Co., LTD., Wuhan (CN)

(72) Inventors: Yu Cai, Wuhan (CN); Yaqi Kuang, Shanghai (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 778 days.

(21) Appl. No.: 17/701,465

(22) Filed: Mar. 22, 2022

(65) Prior Publication Data

US 2023/0157062 A1    May 18, 2023

(51) Int. Cl.
  *H10K 59/38*  (2023.01)
  *H10K 50/858* (2023.01)
  *H10K 50/86*  (2023.01)
  *H10K 59/122* (2023.01)
  *H10K 59/173* (2023.01)

(52) U.S. Cl.
  CPC ......... *H10K 50/858* (2023.02); *H10K 50/865* (2023.02); *H10K 59/122* (2023.02); *H10K 59/173* (2023.02); *H10K 59/38* (2023.02)

(58) Field of Classification Search
  CPC .... H01K 59/122; H01K 59/173; H01K 59/38; H01K 50/858; H01K 50/865
  USPC ....................................................... 313/506
  See application file for complete search history.

(56) References Cited

U.S. PATENT DOCUMENTS

| | | | |
|---|---|---|---|
| 2020/0227489 A1* | 7/2020 | Kim | H10K 59/353 |
| 2020/0365666 A1* | 11/2020 | Kim | H10K 50/858 |
| 2021/0351381 A1* | 11/2021 | Cai | H10K 59/879 |
| 2022/0052298 A1* | 2/2022 | Ge | H10K 50/858 |
| 2023/0006002 A1* | 1/2023 | Wang | H10K 59/353 |
| 2023/0371305 A1* | 11/2023 | Cai | H10K 59/879 |

FOREIGN PATENT DOCUMENTS

| | | |
|---|---|---|
| CN | 113471388 A | 10/2021 |
| WO | 2020171370 A1 | 8/2020 |

\* cited by examiner

*Primary Examiner* — Christopher M Raabe
(74) *Attorney, Agent, or Firm* — Anova Law Group, PLLC (57) ABSTRACT

Display panel and display device are provided. The display panel includes a first display area and a second display area. A light transmittance of the first display area is greater than a light transmittance of the second display area. the display panel further includes a substrate, a light emitting device layer disposed on a side of the substrate, and a dimming layer including at least one first dimming unit in the first display area. The light emitting device layer includes a pixel defining layer with a plurality of pixel openings and a plurality of light emitting units disposed in the plurality of pixel openings. The at least one first dimming unit includes a first refraction section on a side of the light emitting device layer away from the substrate and a second refraction section covering the first refraction section on a side away from the substrate.

18 Claims, 8 Drawing Sheets

DISPLAY PANEL AND DISPLAY DEVICE

CROSS-REFERENCE TO RELATED APPLICATION

This application claims priority of Chinese Patent Application No. 202111309081.X, filed on Nov. 15, 2021, the entire contents of which are hereby incorporated by reference.

FIELD OF THE DISCLOSURE

The present disclosure generally relates to the field of display technology and, more particularly, relates to a display panel and a display device.

BACKGROUND

With a rapid development of terminal devices, higher requirements for display have been placed on terminal devices. Current display technology is mainly divided into liquid crystal display (LCD) technology, organic light emitting display (OLED) technology, and light emitting diode (LED) display technology. The OLED technology is based on a recombination of electrons and holes of organic materials to emit light to achieve a display of different colors. OLED devices are self-luminous devices, which have advantages of fast response speed, high brightness, wide viewing angle, and low power consumption.

With a development of mobile phone industry, an under-screen camera technology has gradually become a trend of focus. The under-screen camera technology brings a better visual enjoyment and an all-round display without interference. Current under-screen camera technology is to set up a camera on a side of a screen with a light-transmitting area. The camera realizes imaging through a gap between pixel units in the light-transmissible area. To improve a sharpness of the camera imaging, current main method is to reduce number of pixel units in the light-transmissible area to reduce a loss caused by external light passing through the light-transmissible area. However, reducing the number of pixel units in the light-transmissible area results in different light emitting effects in the light-transmitting area and a non-light-transmitting area, thereby reducing a user experience.

There is thus a need to provide a display panel and a display device to at least solve the above technical problems.

BRIEF SUMMARY OF THE DISCLOSURE

One aspect of the present disclosure provides a display panel. The display panel includes a first display area and a second display area. A light transmittance of the first display area is greater than a light transmittance of the second display area. the display panel further includes a substrate, a light emitting device layer disposed on a side of the substrate, and a dimming layer including at least one first dimming unit in the first display area. The light emitting device layer includes a pixel defining layer with a plurality of pixel openings and a plurality of light emitting units disposed in the plurality of pixel openings. The at least one first dimming unit includes a first refraction section on a side of the light emitting device layer away from the substrate and a second refraction section covering the first refraction section on a side away from the substrate. A refractive index $n_1$ of the first refraction section is smaller than a refractive index $n_2$ of the second refraction section. The first refraction section includes a first dimming opening corresponding to a first pixel opening in the first display area. A projection of the first dimming opening along a direction perpendicular to the substrate overlaps a projection of the first pixel opening along the direction perpendicular to the substrate.

Another aspect of the present disclosure provides a display device. The display device includes a display panel. The display panel includes a first display area and a second display area. A light transmittance of the first display area is greater than a light transmittance of the second display area. the display panel further includes a substrate, a light emitting device layer disposed on a side of the substrate, and a dimming layer including at least one first dimming unit in the first display area. The light emitting device layer includes a pixel defining layer with a plurality of pixel openings and a plurality of light emitting units disposed in the plurality of pixel openings. The at least one first dimming unit includes a first refraction section on a side of the light emitting device layer away from the substrate and a second refraction section covering the first refraction section on a side away from the substrate. A refractive index $n_1$ of the first refraction section is smaller than a refractive index $n_2$ of the second refraction section. The first refraction section includes a first dimming opening corresponding to a first pixel opening in the first display area. A projection of the first dimming opening along a direction perpendicular to the substrate overlaps a projection of the first pixel opening along the direction perpendicular to the substrate.

Other aspects of the present disclosure can be understood by a person skilled in the art in light of the description, the claims, and the drawings of the present disclosure.

BRIEF DESCRIPTION OF THE DRAWINGS

To describe technical solutions more clearly in embodiments of the present disclosure or existing technologies, the following will briefly introduce accompanying drawings that need to be used in the description of the embodiments or the existing technologies. The accompanying drawings in the following description are only some embodiments of the present disclosure. For a person skilled in the art, other drawings can be obtained from the accompanying drawings without creative efforts.

Reference Numeral List: 1000—display device; 100—display panel; 10—first display area; 20—second display area; 1—substrate; 2—light emitting device layer; 21—pixel defining layer; 211—first pixel opening; 212—second pixel opening; 213—third pixel opening; 22—light emitting unit; 3—dimming layer; 31—first dimming unit; 311—first refraction section; 312—second refraction section; 313—first dimming opening; 314—first sidewall; 32—second dimming unit; 321—third refraction section; 322—fourth refraction section; 323—second dimming opening; 324—second sidewall; 33—third dimming unit; 331—fifth refraction section; 332—sixth refraction section; 333—third dimming opening; 4—encapsulation layer; 41—first inorganic encapsulation layer; 42—organic encapsulation layer; 43—second inorganic encapsulation layer; 5—cap layer; 6—touch layer; 61—touch metal electrode; 62—first touch insulation layer; 63—second touch insulation layer; 7—filter layer; 71—first color filter layer; 72—black matrix layer; and 73—second color filter layer.

DETAILED DESCRIPTION

Features and exemplary embodiments of various aspects of the present disclosure will be described below in detail. In the following detailed description, many specific details are proposed to provide a comprehensive understanding of the present disclosure. Obviously, for a person skilled in the art, the present disclosure can be implemented without some of the specific details. The following description of the embodiments is only to provide a better understanding of the present disclosure by showing examples of the present disclosure.

It should be noted that the embodiments in the present disclosure and the features in the embodiments can be combined with each other in case of no conflict. The embodiments will be described below in detail with reference to the accompanying drawings.

Figure 1:
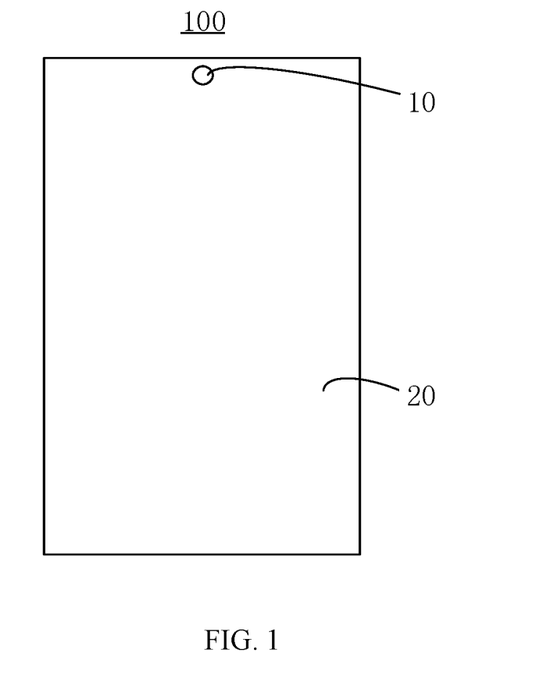
FIG. 1 illustrates a planar structure diagram of a display panel consistent with various embodiment of the present disclosure.

The present disclosure provides a display panel and a display device. To better understand technical solutions and technical effects of the present disclosure, specific embodiments will be described below in detail with reference to the accompanying drawings Referring to FIGS. 1 and 2, a display panel 100 includes a first display area 10 and a second display area 20. A light transmittance of the first display area 10 is greater than a light transmittance of the second display area 20. A side of the display panel 100 that emits light is a light emitting side, and a side opposite to the light emitting side is a backlight side. A light transmittance of the first display area 10 is greater than a light transmittance of the second display area 20. Compared with the second display area 20, the first display area 10 allows more external light to pass through the display panel 100 from the light emitting side and emit from the backlight side.

Figure 2:
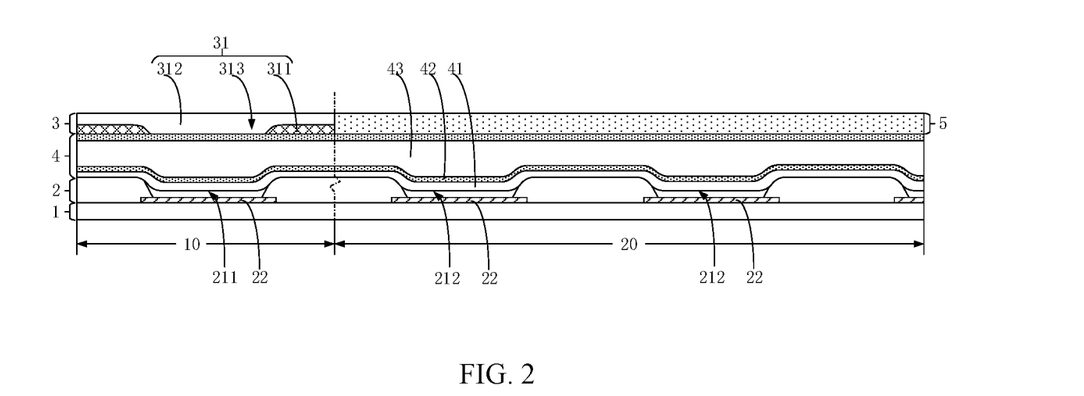
FIG. 2 illustrates a cross-sectional diagram of a display panel consistent with various embodiment of the present disclosure.

The display panel 100 includes a substrate 1, a light emitting device layer 2 and a dimming layer 3. The light emitting device layer 2 is disposed on a side of the substrate 1. The light emitting device layer 2 includes a pixel defining layer 21 and a plurality of light emitting units 22. The pixel defining layer 21 includes a plurality of pixel openings. The plurality of light emitting units 22 is disposed on the plurality of pixel openings. The plurality of light emitting units 22 may be light emitting units 22 capable of emitting light of different colors respectively such as red light emitting units capable of emitting red light, green light emitting units capable of emitting green light, and blue light emitting units capable of emitting blue light. Exemplarily, as shown in FIG. 2, in one embodiment, an organic light emitting diode (OLED) may be selected to make each of the plurality of light emitting units 22 described above. Alternatively, the plurality of light emitting units 22 can also be configured as micro light emitting diodes (Micro-LED) or quantum light emitting diodes (QLED).

Light emitting units 22 in the first display area 10 may be more sparsely distributed than light emitting units 22 in the second display area 20, so that a distance between adjacent light emitting units 22 in the first display area 10 is larger than that a distance between adjacent light emitting units 22 in the second display area 20 to realize that a light transmittance of the first display area 10 is greater than a light transmittance of the second display area 20. Alternatively, a size of the light emitting unit 22 in the first display area 10 may be smaller than a size of the light emitting unit 22 in the second display area 20 to realize, when a spacing between adjacent light emitting units 22 in the first display area 10 is consistent with a spacing between adjacent light emitting units 22 in the second display area 20, that a light transmittance of the first display area 10 is greater than a light transmittance of the second display area 20, Compared with the second display area 20, a side of the first display area 10 away from a light emitting surface of the display panel 100 is more suitable for disposing a photosensitive element such as a camera to sense light emitted from the backlight side of the display panel 100 through the display panel 100 from the light emitting side of the display panel 100.

Figure 3:
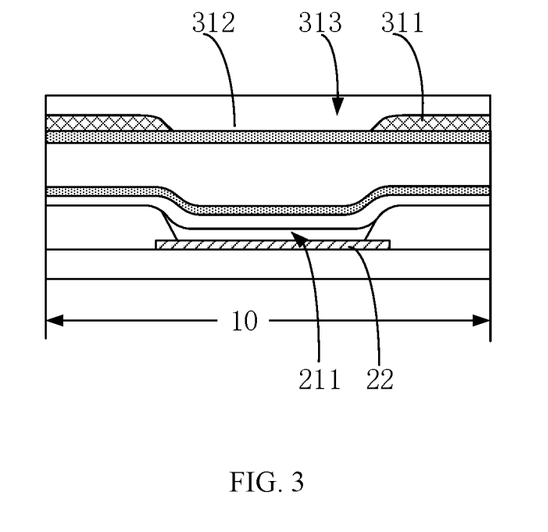
FIG. 3 illustrates a partial cross-sectional diagram of a display panel consistent with various embodiment of the present disclosure.

Referring to FIG. 3, the dimming layer 3 includes at least one first dimming unit 31. The first dimming unit 31 is in the first display area 10 and is disposed on a side of the light emitting device layer 2 away from the substrate 1. The first dimming unit 31 includes a first refraction section 311 on the side of the light emitting device layer 2 away from the substrate 1 and a second refraction section 312 covering the first refraction section 311 on a side away from the substrate 1. The first refraction section 311 includes a first dimming opening 313 corresponding to a first pixel opening 211 in the first display area 10. A projection of the first dimming opening 313 along a direction perpendicular to the substrate 1 overlaps a projection of the first pixel opening 211 along the direction perpendicular to the substrate 1. That is, the first dimming opening 313 at least partially exposes the light emitting unit 22 corresponding to the first dimming opening 313. The second refraction section 312 is in contact with the first refraction section 311. The second refraction section 312 covers the first refraction section 311. The second refraction section 312 fills the first dimming opening 313.

In some embodiments, a refractive index $n_1$ of the first refraction section 311 is smaller than a refractive index $n_2$ of the second refraction section 312, so that after refracted or reflected by a first refraction section 311, light emitted by the light emitting unit 22 continues to exit through the second refraction section 312. In addition, since the refractive index of the first refraction section 311 is too low, a difference in refractive index between the first refraction section 311 and the film layer covered by the first refraction section 311 is too large. As a result, a reflection loss of light emitted by the light emitting unit 22 at an interface where the first refraction section 311 and the lower film layer is in contact is too high, which is not conducive to light emission. If the refractive index of the second refraction section 312 is too high, when the second refraction section 312 emits light, a reflection loss at an exit interface of the second refraction section 312 is too high, which is not conducive to light emission. Therefore, the refractive index of the first refraction section 311 may be in a range of 1.3 to 1.6, and the refractive index of the second refraction section 312 may be in a range of 1.6 to 1.8. A person skilled in the art can realize different dimming effects of the first dimming unit 31 on the light emitting unit 22 by selecting the first refraction section 311 and the second refraction section 312 with different refractive indexes.

Optionally, along a light emitting direction X, a maximum thickness of the second refraction section 312 is greater than a maximum thickness of the first refraction section 311, thereby ensuring a maximum light extraction efficiency of the first refraction section 311. Meanwhile, the second refraction section 312 can be formed in one process. Since the second refraction section 312 is an organic layer, a surface of the second refraction section 312 away from the substrate 1 can be made as flat as possible, thereby improving a flatness of the first display area 10 and significantly improving a display effect and a light sensing effect of the first display area 10.

The dimming layer 3 may only be disposed in the first display area 10. That is, light emitted by the light emitting unit 22 in the second display area 20 is directly emitted outward without an angle adjustment by the dimming layer 3. In one embodiment, a cap layer 5 is disposed on the side of the light emitting device layer 2 away from the substrate 1. The cap layer 5 and the dimming layer 3 are disposed in a same layer. Meanwhile, to ensure a flat surface of the display panel 100, the cap layer 5 has a same thickness as the dimming layer 3. That is, a surface of the cap layer 5 away from the substrate 1 and a surface of the dimming layer 3 away from the substrate 1 are a same flat surface. Since a surface of the second refraction section 312 away from the substrate 1 is not covered with the cap layer 5, a hardness of the second refraction section 312 can be increased, so that the second refraction section 312 can protect the first refraction section 311. A material of the second refraction section 312 can be acrylic, such as an epoxy resin material mixed with metal oxide nanoparticles with high refractive indexes. The metal oxide nanoparticles can be zirconium oxide ($ZrO_2$) or titanium oxide ($TiO_2$), A curing energy used in a formation process of the second refraction section 312 can be increased, or a content of the metal oxide nanoparticles in the epoxy resin material can be increased to increase the hardness of the second refraction section 312.

Figure 4:
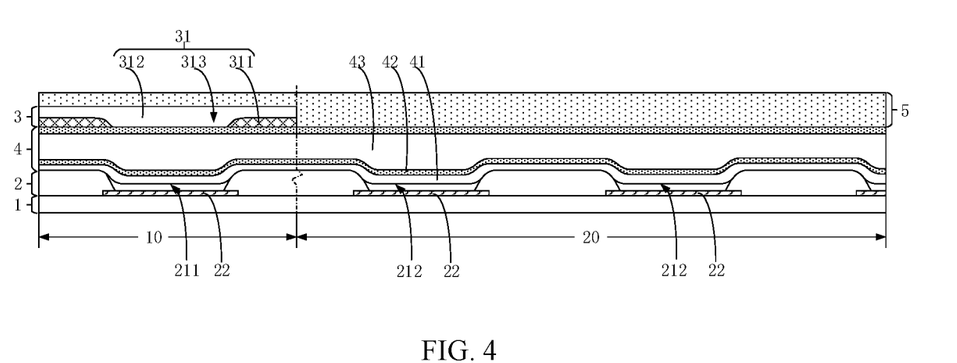
FIG. 4 illustrates another cross-sectional diagram of a display panel consistent with various embodiment of the present disclosure.

Referring to FIG. 4, in one embodiment, the cap layer 5 also covers a side of the dimming layer 3 away from the light emitting device layer 2. To ensure an outer surface of the display panel 100 to be flat, along the light emitting direction X, a thickness of the cap layer 5 in the first display area 10 is less than a thickness of the cap layer 5 in the second display area 20. By adjusting the thickness of the cap layer 5 in different display areas, a thickness difference caused by the dimming layer 3 disposed in the first display area 10 can be compensated.

In some embodiments, the first dimming unit 31 is disposed above the light emitting unit 22 at least partially in the first display area 10. A projection of the light emitting unit 22 on the first refraction section 311 overlaps the first dimming opening 313. After light emitted by the light emitting unit 22 is refracted or reflected by the first refraction section 311 and the second refraction section 312, light emitted from the light emitting unit 22 originally at a large angle is adjusted to light emitted at a small angle and emitted at a normal viewing angle. Emission at the normal viewing angle refers to emission along a normal direction of a plane where the display panel 100 is located.

Different light emitting units 22 can emit different colors, but light emitting units 22 that emit different colors have different luminous efficiencies. Therefore, sizes of the light emitting units 22 that emit different colors can be set to be different to realize a white balance. For example, when there are red light emitting units, green light emitting units and blue light emitting units, sizes of the blue light emitting units may be largest, sizes of the red light emitting units may be smallest, and sizes of the green light emitting units may be medium. Therefore, for the display panel 100 with a plurality of light emitting units 22 for emitting different colors, the first dimming unit 31 may be disposed corresponding to only one or more light emitting units 22 with a relatively low luminous efficiency to improve a luminous efficiency of the one or more light emitting units 22 with the relatively low luminous efficiency. For example, in one embodiment, only red light emitting units in the first display area 10 are disposed with first dimming units 31, light emitted by green light emitting units and blue light emitting units is directly emitted without passing through the first dimming units 31. A person skilled in the art can understand that the light emitting units 22 that emit different colors can be set to have a same size, by disposing first dimming units 31 with different light extraction rates to adjust luminous efficiencies of different light emitting units 22, a problem of different luminous efficiencies of the light emitting units 22 of different colors is overcome and colors of a picture displayed by the display panel 100 are balanced.

In the present disclosure, the light transmittance of the first display area 10 is set to be greater than the light transmittance of the second display area 20. Compared to the second display area 20, a photosensitive element is more suitable to be disposed on the backlight side of the first display area 10. By setting the first dimming opening 313 to correspond to the first pixel opening 211 and setting the refractive index $n_1$ of the first refraction section 311 to be smaller than the refractive index $n_2$ of the second refraction section 312, the first dimming unit 31 can adjust light emitted from the light emitting unit 22 at a large angle to light emitted at a normal viewing angle, thereby improving a light emitting effect of the first display area 10.

Figure 5:
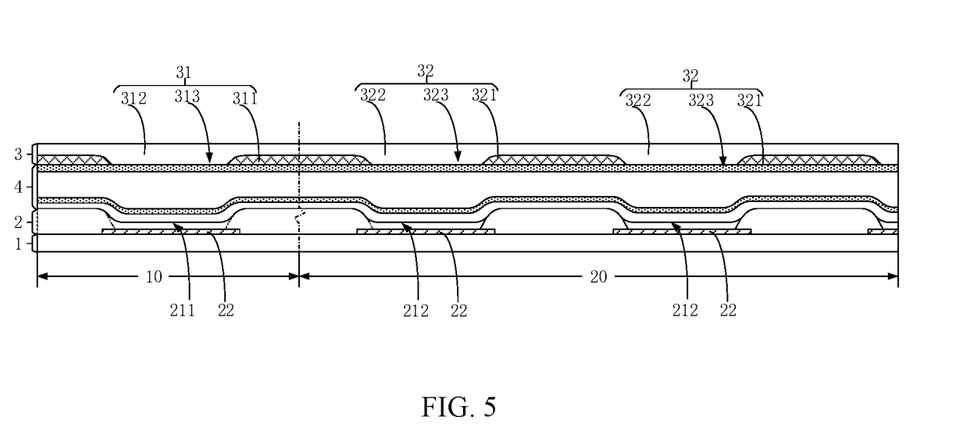
FIG. 5 illustrates another cross-sectional diagram of a display panel consistent with various embodiment of the present disclosure.

Referring to FIG. 5, in some optional embodiments, the dimming layer 3 further includes at least one second dimming unit 32. The at least one second dimming unit 32 is in the second display area 20 and is disposed on the light emitting device layer 2 away from the substrate 1. The at least one second dimming unit 32 includes a third refraction section 321 on the side of the light emitting device layer 2 away from the substrate 1 and a fourth refraction section 322 covering the third refraction section 321 on the side away from the substrate 1. A refractive index $n_3$ of the third refractive section 321 is smaller than a refractive index $n_4$ of the fourth refractive section 322. The third refraction section 321 includes a second dimming opening 323 corresponding to the second pixel opening 212 in the second display area 20. A projection of the second dimming opening 323 along the direction perpendicular to the substrate 1 overlaps a projection of the second pixel opening 212 along the direction perpendicular to the substrate 1. By disposing the first dimming unit 31 and the second dimming unit 32, light emitted by light emitting units 22 in the first display area 10 and light emitted by light emitting units 22 in the second display area 20 can both be adjusted and emitted to increase a light emitting brightness of the entire display panel 100 at a normal viewing angle. Specifically, by adopting materials with different refractive indexes, disposing the first dimming unit 31 and the second dimming unit 32 with different structures, a light extraction rate of the first dimming unit 31 is greater than a light extraction rate of the second dimming unit 32, thereby ensuring that an overall display brightness of the display panel 100 is consistent when a distribution density of the light emitting units 22 in the first display area 10 is different from a distribution density of the light emitting units 22 in the second display area 20.

In some embodiments, in the first display area 10, first dimming units 31 are in one-to-one correspondence with first pixel openings 211 and number of the first dimming units 31 is equal to number of the first pixel openings 211. In the second display area 20, second dimming units 32 are in one-to-one correspondence with second pixel openings 212 and number of the second dimming units 32 is same as number of the second pixel openings 212. That is, each light emitting unit 22 is disposed with a corresponding first dimming unit 31 or a second dimming unit 32 to improve an overall brightness of the display panel 100 within a normal viewing angle range. P first dimming units 31 can be disposed in a unit area S of the first display area 10, Q second dimming units 32 can be disposed in a unit area S of the second display area 20, and P>Q, so that a light extraction rate of the dimming layer 3 in the first display area 10 and a light extraction rate of the dimming layer 3 in the second display area 20 are set differently. When number of light emitting units 22 in the unit area S is P, first dimming units 31 are in one-to-one correspondence with first pixel openings 211, number of the first dimming units 31 is same as number of the first pixel openings 211, and only part of the second pixel opening 212 are in one-to-one correspondence with the second dimming unit 32. Therefore, light emitted by each light emitting unit 22 in the first display area 10 can be adjusted, and the light extraction rate of the dimming layer 3 in the first display area 10 and the light extraction rate of the dimming layer 3 in the second display area 20 are different. The unit area S includes a certain number of light emitting units 22. Number of light emitting units 22 in each unit area S is same. The area S is an area with a certain positional relationship between the light emitting units 22 that emit different colors.

The first refraction section 311 and the third refraction section 321 can be formed in a same layer, and the second refraction section 312 and the fourth refraction section 322 can also be formed in a same layer to facilitate a formation of the dimming layer 3. The first refraction section 311 and the third refraction section 321 can be made of materials with a same refractive index, that is, $n_1=n_3$. And/or the second refraction section 312 and the fourth refraction section 322 may be made of materials with a same refractive index, that is, $n_2=n_4$. When $n_1=n_3$ and $n_2=n_4$, the first refraction section 311 and the third refraction section 321 can be set to have different shapes and structures, and/or the second refraction section 312 and the fourth refraction section 322 can be set to have different shapes and structures, so that the first dimming unit 31 and the second dimming unit 32 have different optical characteristics to change a light emitting angle of the light emitting unit 22. A shape and a structure of each refraction section are different. Specifically, the first dimming opening 313 and the second dimming opening 323 are different in size and structure, or the first refraction section 311 and the third refraction section 321 are different in height, or a curvature of a boundary line between the first refraction section 311 and the second refraction section 312 is different from a curvature of a boundary line between the third refraction section 321 and the fourth refraction section 322.

Structures of the first dimming unit 31 and the second dimming unit 32 can be same, and only materials used in the first dimming unit 31 and the second dimming unit 32 have different settings. Specifically, the first refraction section 311 and the third refraction section 321 are made of different materials in a same layer, and the second refraction section 312 and the fourth refraction section 322 are made of a same material in a same layer; or the first refraction section 311 and the third refraction section 321 are made of a same material in a same layer, and the second refraction section 312 and the fourth refraction section 322 are made of different materials in a same layer; or the first refraction section 311 and the third refraction section 321 are made of different materials, and the second refraction section 312 and the fourth refraction section 322 are also made of different materials, so that the first dimming unit 31 and the second dimming unit 32 have different light extraction rates. In the above solutions, since the first refraction section 311 and the third refraction section 321 are structures respectively having the first dimming opening 313 and the second dimming opening 323, which are more complicated in structure than the second refraction section 312 and the fourth refraction section 322. The second refraction section 312 and the fourth refraction section 322 may be connected to each other. Therefore, formation steps of a forming scheme in which the first refraction section 311 and the third refraction section 321 are made of different materials in a same layer, and the second refraction section 312 and the fourth refraction section 322 are made of same material in a same layer are relatively simple. Meanwhile, since the second refraction section 312 and the fourth refraction section 322 are formed by a same process and the second refraction section 312 and the fourth refraction section 322 are organic layers, surfaces of the second refraction section 312 and the fourth refraction section 322 away from the substrate 1 can be made as flat as possible without obvious step differences, thereby improving a flatness of the entire display panel 100, and a uniformity of a film thickness of the entire display panel 100.

Optionally, a refractive index difference between the first refractive section 311 and the second refractive section 312 is greater than a refractive index difference between the third refractive section 321 and the fourth refractive section 322. When other parameters that affect a light extraction rate are same and only the refractive index difference is different, the greater the refractive index difference, the higher a corresponding light extraction rate. That is, by changing the refractive index difference, the light extraction rate of the first dimming unit 31 is greater than the light extraction rate of the second dimming unit 32. A dimming principle of a dimming unit is described below by taking the first dimming unit 31 as an example. Part of light emitted by the light emitting unit 22 can be reflected at an interface of the first refraction section 311 and the second refraction section 312. Meanwhile, part of the light emitted by the light emitting unit 22 can also be refracted at the interface of the first refraction section 311 and the second refraction section 312. Since reflected light and refracted light have different exit directions, changing a refraction ratio and a reflection ratio can adjust an intensity of the light emitted in each direction, and changing the refractive index difference between the first refraction section 311 and the second refraction section 312 can adjust a proportion of the refraction ratio and a proportion of the reflection ratio in the first dimming unit 31. Similarly, changing the refractive index difference between the third refraction section 321 and the fourth refraction section 322 can also adjust the reflection ratio and the refraction ratio of light in the second dimming unit 32. Therefore, the refractive index difference between the first refraction section 311 and the second refraction section 312 can range from 0.3 to 0.4, and the refractive index difference between the third refraction section 321 and the fourth refraction section 322 can range from 0.3 to 0.4. $(n_2-n_1)$ is controlled to be greater than $(n_4-n_3)$ to balance the reflection ratio and the refraction ratio of light in the dimming unit and increase a light emitting rate of the display panel 100 emitting light at a normal viewing angle.

As shown above, the light extraction rate of the dimming layer 3 is related to a refractive index of each refraction section, while a change of the light extraction rate is not equal to a change of the refractive index of the refraction section. That is, if the change of the refractive index of the refraction section is 1, the change of the light extraction rate may not necessarily be 1. Therefore, when $(n_2-n_1)=(n_4-n_3)$, the refractive index of the first refraction section 311 and the refractive index of the third refraction section 321 may be set to be different and the refractive index of the second refraction section 312 and the refractive index of the fourth refraction section 322 may be set to be different, so as to realize that the light extraction rate of the first dimming unit 31 and the light extraction rate of the second dimming unit 32 are different.

Figure 6:
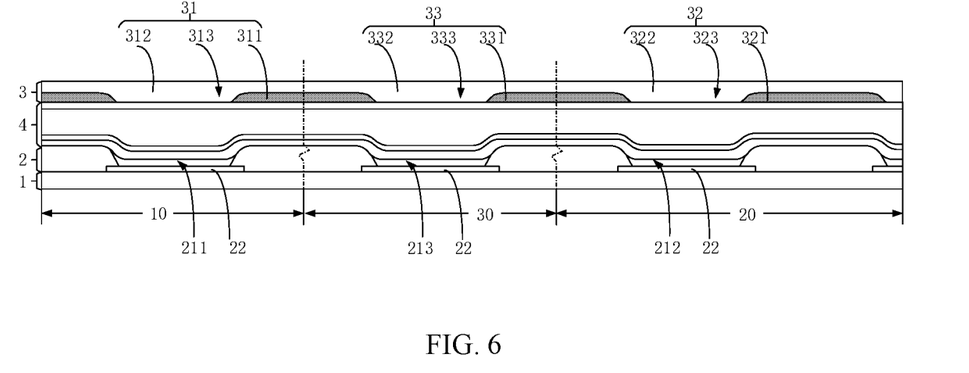
FIG. 6 illustrates another cross-sectional diagram of a display panel consistent with various embodiment of the present disclosure.

Referring to FIG. 6, in some embodiments, the dimming layer 3 further includes at least one third dimming unit 33 disposed on the side of the light emitting device layer 2 away from the substrate 1. Along a direction of the first display area 10 pointing to the second display area 20, the at least one third dimming unit 33 is disposed between the first dimming unit 31 and the second dimming unit 32. The at least one third dimming unit 33 includes a fifth refraction section 331 on the side of the light emitting device layer 2 away from the substrate 1 and a sixth refraction section 332 covering the fifth refraction section 331 on the side away from the substrate 1. A refractive index $n_5$ of the fifth refraction section 331 is smaller than a refractive index $n_6$ of the sixth refraction section 332. The fifth refraction section 331 includes a third dimming opening 333 corresponding to a third pixel opening 213. Along the direction of the first display area 10 pointing to the second display area 20, the third pixel opening 213 is located between the first pixel opening 211 and the second pixel opening 212. A projection of the third dimming opening 333 along the direction perpendicular to the substrate 1 overlaps a projection of the third pixel opening 213 along the direction perpendicular to the substrate 1, and $(n_2-n_1)>(n_6-n_5)>(n_4-n_3)$.

A transition display area 30 can be disposed between the first display area 10 and the second display area 20 to connect the first display area 10 and the second display area 20. Part of light emitting units 22 is distributed in the transition display area 30. Third dimming units 33 can be disposed in one-to-one correspondence with the light emitting units 22 in the transition display area 30.

According to the above principle, when other parameters that affect a light extraction rate are same, only the refractive index difference is different, the larger the refractive index difference, the higher a corresponding light extraction rate. Therefore, by changing the refractive index difference, the light extraction rate of the first dimming unit 31 can be greater than a light extraction rate of a third dimming unit 33, and the light extraction rate of the third dimming unit 33 is greater than the light extraction rate of the second dimming unit 32, so that no obvious light-dark boundary is located between the first display area 10 and the second display area 20 when the display panel 100 emits light.

In some embodiments, the dimming layer 3 includes a plurality of third dimming units 33. Along the direction of the first display area 10 pointing to the second display area 20, a refractive index difference $(n_6-n_5)$ in the plurality of third dimming unit 33 gradually decreases. The plurality of third dimming units 33 is not only different in light extraction rate from the first dimming unit 31 and the second dimming unit 32. Light extraction rates can also be set differently among the plurality of third dimming units 33 by changing the refractive index difference so that a gradual setting of light emission brightness from the first display area 10 to the second display area 20 is realized by setting light extraction rates differently among the plurality of third dimming units 33.

At least two of the second refraction section 312, the fourth refraction section 322, and the sixth refraction section 332 are made of a same material in a same layer to reduce forming processes and improve a forming efficiency. When all the second refraction section 312, the fourth refraction section 322, and the sixth refraction section 332 are made of a same material in a same layer, fewer forming processes are needed. The first refraction section 311, the third refraction section 321, and the fifth refraction section 331 can also be made of a same material in a same layer. Meanwhile, by changing each section to have a different shape and structure, a light extraction rate of each dimming unit can be different.

Figure 7:
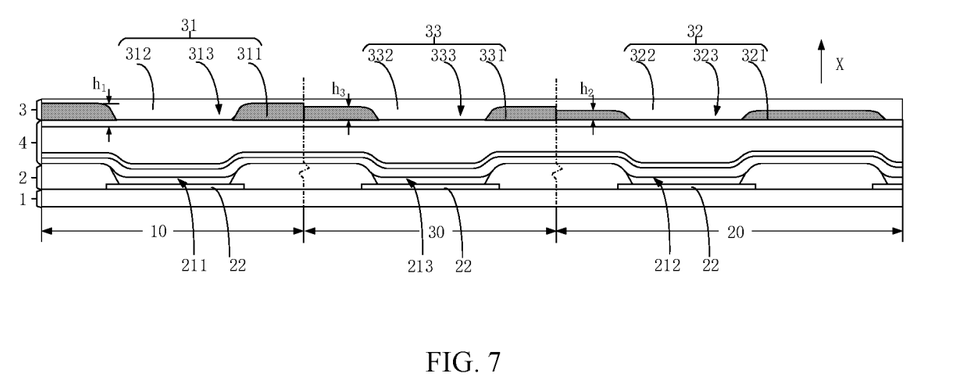
FIG. 7 illustrates another cross-sectional diagram of a display panel consistent with various embodiment of the present disclosure.
Figure 8:
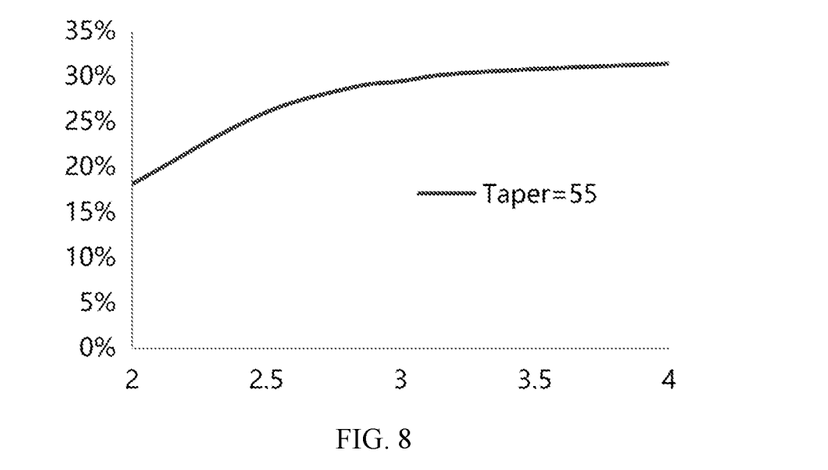
FIG. 8 illustrates a curve diagram of a height of a first refraction section of a display panel and a light extraction rate of a first dimming unit consistent with various embodiment of the present disclosure.

Referring to FIG. 7, along the light emitting direction X, a maximum height of the first refraction section 311 is $h_1$, and a maximum height of the third refraction section 321 is $h_2$. As shown in FIG. 8, an abscissa is a height of the first refraction section 311, an ordinate is the light extraction rate of the first dimming unit 31, and a curve illustrates a change of the light extraction rate of the first dimming unit 31 with a slope angle of 55° when the height of the first refraction section 311 is a variable. As can be seen from the curve, in a dimming unit with a slope angle within a certain range, when the height of the first refraction section 311 increases, the light extraction rate increases. The slope angle is a maximum included angle between a first sidewall 314 of the first refraction section 311 and a plane where the substrate 1 is located. The slope angle is generally between 40° and 50°. In the dimming unit with a slope angle within a certain range, when other parameters that affect the light extraction rate are same and only heights of refraction sections with low refractive indexes are different, if a height of the first refraction section 311 or a height of the third refraction section 321 increases, a corresponding light extraction rate increases. That is, if $h_1$ is greater than $h_2$, a light extraction rate of the first refraction section 311 is greater than a light extraction rate of the third refraction section 321. On the one hand, if the height of the first refraction section 311 and/or the height of the third refraction section 321 is too high, a corresponding thickness of the dimming layer 3 may increase, thereby increasing a thickness of the display panel 100, which is not conducive to a thin design of the display panel 100. Meanwhile, to ensure that the first refraction section 311 or the third refraction section 321 has a suitable slope angle, if the height of the first refraction section 311 or the height of the third refraction section 321 is too high, the first dimming unit 31 or the second dimming unit 32 may be relatively large, which cannot be adapted to the light emitting unit 22 disposed in the light emitting device layer 2. On the other hand, if the height of the first refraction section 311 is too low, the light extraction rate is too low to meet adjustment requirements of the first display area 10. Therefore, 2.5 µm≤$h_1$≤4 µm and/or $h_2$≤2 µm can be set.

In other embodiments, $h_1$ is equal to $h_2$. By referring to the above embodiments, making the light extraction rate of the first dimming unit 31 and the light extraction rate of the second dimming unit 32 different can be realized by selecting materials with different refractive indexes, setting different sizes of dimming openings and so on.

When the third dimming unit 33 is disposed, along the light emitting direction X, a maximum height of the fifth refraction section 331 is $h_3$, and $h_1$>$h_3$>$h_2$. That is, maximum heights of the first refraction section 311, the fifth refraction section 331, and the third refraction section 321 decrease sequentially, so that light extraction rates of the first dimming unit 31, the third dimming unit 33, and the second dimming unit 32 decrease sequentially. Therefore, when the display panel 100 emits light, the first display area 10 and the second display area 20 have no obvious light-dark boundaries.

When the dimming layer 3 includes a plurality of third dimming units 33, along the direction of the first display area 10 pointing to the second display area 20, the maximum height $h_3$ of the fifth refraction section 331 gradually decreases. That is, among a plurality of third dimming units 33 between the first dimming unit 31 and the second dimming unit 32, the maximum height $h_3$ of the fifth refraction section 331 is set to be tapered, so that a transition between the first display area 10 and the second display area 20 is uniform without obvious light-dark boundaries. When 2.5 µm≤$h_1$≤4 µm and $h_2$≤2 µm, 2 µm<$h_3$<2.5 µm can be set.

Figure 9:
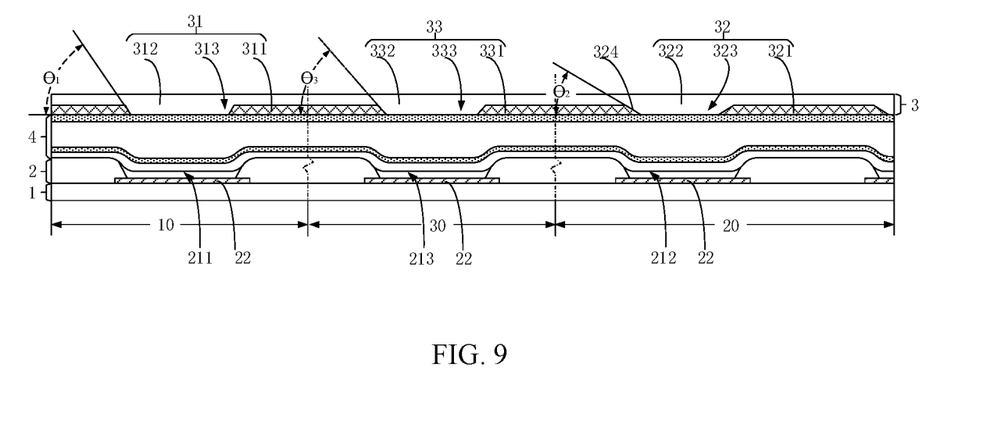
FIG. 9 illustrates another cross-sectional diagram of a display panel consistent with various embodiment of the present disclosure.
Figure 10:
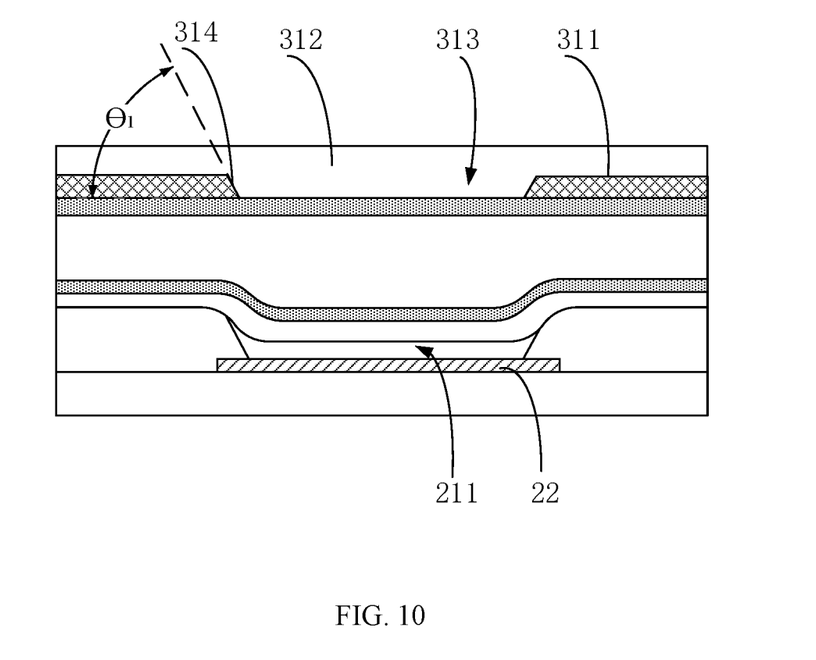
FIG. 10 illustrates another partial cross-sectional diagram of a display panel consistent with various embodiment of the present disclosure.
Figure 11:
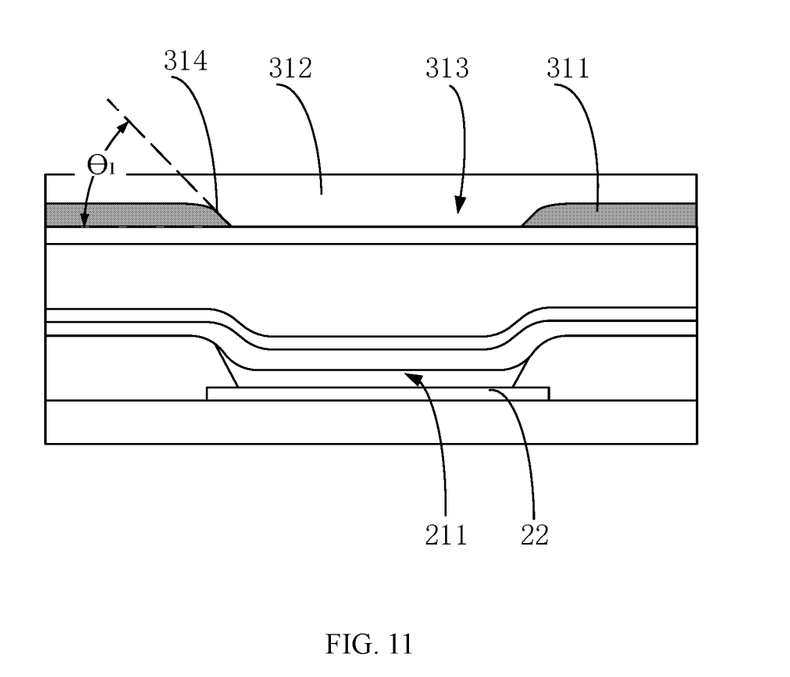
FIG. 11 illustrates another partial cross-sectional diagram of a display panel consistent with various embodiment of the present disclosure.

Referring to FIGS. 9 and 10, the first refraction section 311 includes the first sidewall 314. A maximum included angle between the first sidewall 314 and the plane where the substrate 1 is located is $\theta_1$, which is the slope angle described above. Referring to FIG. 11, a dotted line in FIG. 11 is a tangent line of a certain point of the first sidewall 314 in the plane where the substrate 1 is located. The first sidewall 314 is a curved surface. A tangent is made at each point of the curved surface. A maximum value of an angle between each tangent and the plane where the substrate 1 is located is $\theta_1$. In a cross-sectional structure of the first refraction section 311 along a light emitting direction, the first sidewall 314 may also be in a straight-line state as shown in FIG. 10. That is, in the embodiments of the present disclosure, a meaning included in the slope angle is that, regardless of whether a sidewall forming the dimming opening is a plane or a curved surface, a maximum angle formed by a cut plane of the sidewall and the plane where the substrate is located is the slope angle.

Figure 12:
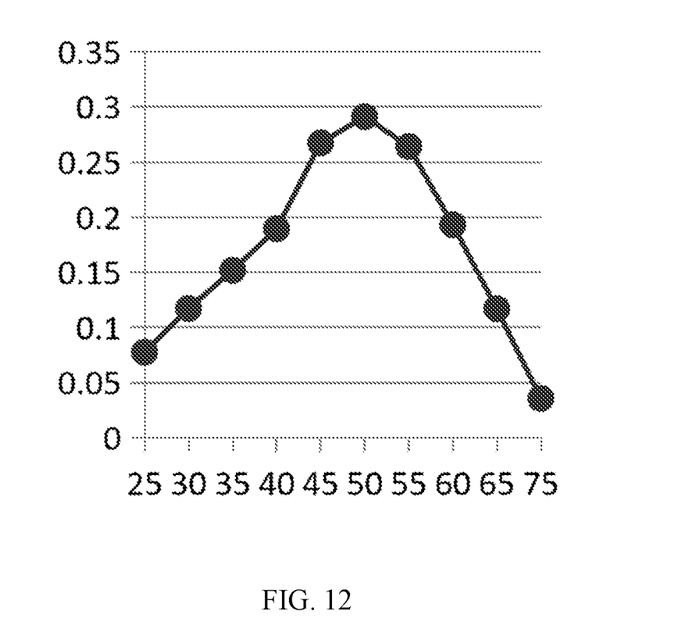
FIG. 12 illustrates a curve diagram of a slope angle of a first refraction section of a display panel and a light extraction rate of a first dimming unit of a display panel consistent with various embodiment of the present disclosure.

Referring to FIG. 12, an abscissa is the slope angle, an ordinate is the light extraction rate, and a curve illustrates a change of the light extraction rate of the first dimming unit 31 when the height of the first refraction section 311 is a variable. When the slope angle is within a range, as an included angle increases, a refraction effect becomes more pronounced. When the slope angle is within another certain range, as an included angle increases, the refraction effect becomes weaker, and refraction improves a light effect of normal viewing angle more than reflection. Specifically, in a curve shown in FIG. 12, when the slope angle is less than 50°, the light extraction rate is positively correlated with the slope angle. When the slope angle is greater than 50°, the light extraction rate is negatively correlated with the slope angle. When the slope angle in a range of 50°±5°, a corresponding light extraction rate is relatively high. Therefore, in some embodiments, 45°≤$\theta_1$≤55°.

The third refraction section 321 includes a second sidewall 324. A maximum included angle between the second sidewall 324 and the plane where the substrate 1 is located is $\theta_2$, which is the slope angle of the third refraction section 321. With reference to a correlation between the slope angle and the light extraction rate described above, optionally, $\theta_2$<45° or $\theta_2$>55°. By setting the slope angle $\theta_2$ of the third refraction section 321 within the above range, the first refraction section 311 and the third refraction section 321 with different slope angles respectively obtain different light extraction rates, and the light extraction rate of the first dimming unit 31 is lower than the light extraction rate of the second dimming unit 32. Along the direction of the first display area 10 pointing to the second display area 20, the third dimming unit 33 can also be disposed between the first dimming unit 31 and the second dimming unit 32. The fifth refraction section 331, the first refraction section 311, and the third refraction section 321 can also be disposed with different slope angles, to make the light extraction rate of the third dimming unit 33 between light extraction rates of the first dimming unit 31 and the second dimming unit 32 and reduce a brightness difference between the first display area 10 and the second display area 20. For example, in one embodiment, the slope angle $\theta_2$ of the third refraction section 321 is less than 45°, the slope angle $\theta_1$ of the first refraction section 311 and the slope angle $\theta_3$ of the fifth refraction section 331 are both greater than 45° and less than 55°. and $\theta_1$>$\theta_3$.

Figure 13:
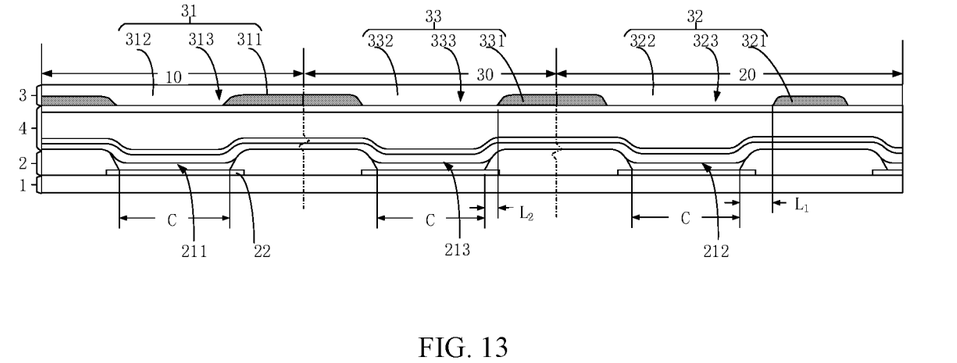
FIG. 13 illustrates another cross-sectional diagram of a display panel consistent with various embodiment of the present disclosure.

Referring to FIG. 13, the pixel defining layer 21 has a plurality of pixel openings, A pixel opening in the first display area 10 is a first pixel opening 211. A pixel opening in the second display area 20 is a second pixel opening 212. A size of a pixel opening can be C, which is not limited herein and can be designed according to actual conditions. The first pixel opening 211 exposes a light emitting unit 22 corresponding to the first pixel opening 211. That is, light emitting units 22 in the first display area 10 are in one-to-one correspondence with first pixel openings 211. A projection of the light emitting unit 22 in the first display area 10 on the pixel defining layer 21 is in the first pixel opening 211.

In practical applications, a shape of a first dimming opening 313 can be changed according to a shape of a first pixel opening 211. For example, a projection of the first pixel opening 211 on the substrate 1 may be a rectangle, a projection of the first dimming opening 313 on the substrate 1 may also be a rectangle, and the projection of the first dimming opening 313 on the substrate 1 overlaps the projection of the first pixel opening 211 on the substrate 1. Based on limitations of an actual process, the projection of the first pixel opening 211 on the substrate 1 and the projection of the first dimming opening 313 on the substrate 1 may not be completely right-angled rectangles but may also be rounded rectangles.

Similarly, the second pixel opening 212 may expose a light emitting unit 22 corresponding to the second pixel opening 212. That is, in the second display area 20, light emitting units 22 are in one-to-one correspondence with second pixel openings 212. Based on the above description, a size of the second dimming opening 323 and a size of the second pixel opening 212 may be different. In some embodiments, a projection center of the second dimming opening 323 along the direction perpendicular to the substrate 1 overlaps a projection center of the second pixel opening 212 along the direction perpendicular to the substrate 1. A minimum distance between a projection boundary of the second dimming opening 323 along the direction perpendicular to the substrate 1 and a projection boundary of the second pixel opening 212 along the direction perpendicular to the substrate 1 is $L_1$, and $|L_1| 1$ μm. In some embodiments, since sizes of light emitting units 22 for emitting different colors are different, sizes of the second pixel openings 212 corresponding to the light emitting units 22 for emitting different colors are also different. Therefore, based on a same size of the second dimming openings 323, minimum distances $L_1$ between the light emitting units 22 of a same color and the second dimming openings 323 are same.

Figure 14:
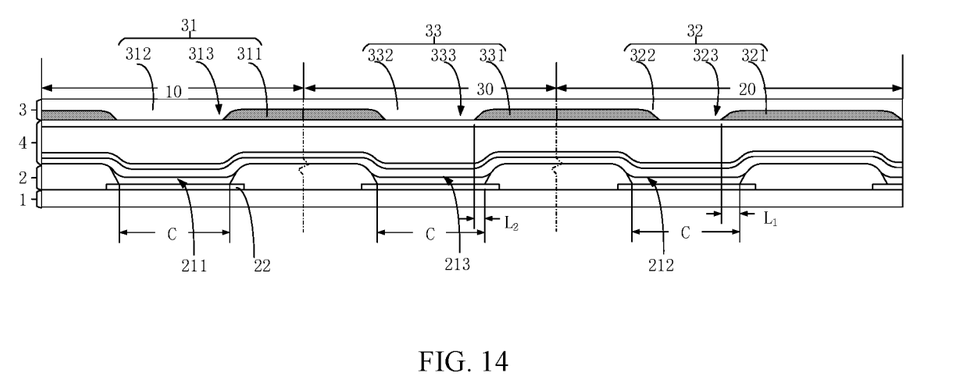
FIG. 14 illustrates another cross-sectional diagram of a display panel consistent with various embodiment of the present disclosure.
Figure 15:
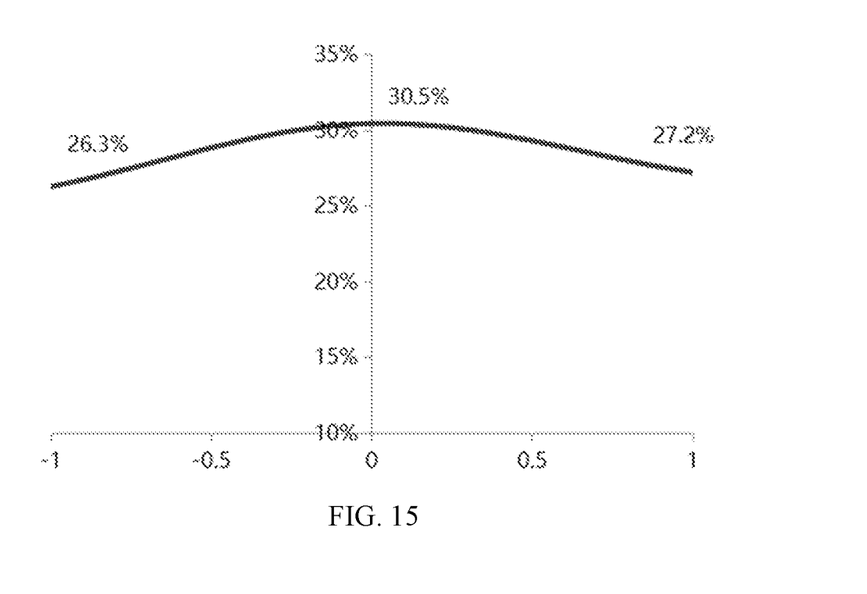
FIG. 15 illustrates a curve diagram of a minimum distance $L_1$ of a second dimming opening of a display panel and a light extraction rate of a second dimming unit of a display panel consistent with various embodiment of the present disclosure.

A line where the second sidewall 324 and a lower surface of the third refraction section 321 intersect is a bottom edge of the second sidewalls 324. The bottom edge of the second sidewall 324 is on a side of the second sidewalls 324 close to the second pixel opening 212, or a top edge of the second sidewall 324 is on a side of the second sidewalls 324 away from the second pixel opening 212. The second pixel opening 212 also has a sidewall. A line where the sidewall of the second pixel opening 212 and a plane parallel to the plane where the substrate 1 intersects is a bottom edge of the second pixel opening 212. A gap may be located between a projection of the bottom edge of the second sidewall 324 on the substrate 1 and a projection of the bottom edge of the second pixel opening 212 on the substrate 1. A minimum value of the gap is the minimum distance $L_1$. As shown in FIG. 13, when the minimum distance $L_1$ is less than 0, a projection of the bottom edge of the second sidewall 324 on the substrate 1 is outside a projection of the bottom edge of the second pixel opening 212 on the substrate 1. As shown in FIG. 14, when the minimum distance $L_1$ is less than 0, the projection of the bottom edge of the second sidewall 324 on the substrate 1 is inside the projection of the bottom edge of the second pixel opening 212 on the substrate 1. In other words, the second dimming opening 323 can either expand outward or contract inward relative to the second pixel opening 212. The minimum distance is positive when the second dimming opening 323 expands outward, and the minimum distance is negative when the second dimming opening 323 contracts inward. Referring to FIG. 15, an ordinate is the minimum distance $L_1$, and an abscissa is the light extraction rate. As can be seen from FIG. 15, a change of the minimum distance $L_1$ can affect the light extraction rate. The minimum distance $|L_1|$ is negatively correlated with the light extraction rate. When the minimum distance $L_1$ is equal to 0, the light extraction rate is highest. When the slope angle remains unchanged, if sizes of the second pixel opening 212 and the second dimming opening 323 are changed, the minimum distances $L_1$ between the projection boundary of the second pixel opening 212 and the second dimming opening 323 on the substrate 1 is changed, so that a refraction effect and a reflection effect of the third refraction section 321 on light emitted by the light emitting unit 22 are changed to realize an adjustment of the light extraction of the second dimming unit 32.

When the third dimming unit 33 is disposed, along the direction of the first display area 10 pointing to the second display area 20, the third pixel opening 213 is located between the first pixel opening 211 and the second pixel opening 212. The projection of the third dimming opening 333 along the direction perpendicular to the substrate 1 overlaps the projection of the third pixel opening 213 along the direction perpendicular to the substrate 1. A minimum distance between a projection boundary of the third dimming opening 333 along the direction perpendicular to the substrate 1 and a projection boundary of the third pixel opening 213 along the direction perpendicular to the substrate 1 is $L_2$, and $0<|L_2|<1$ μm. Therefore, the light extraction rate of the first dimming unit 31 is greater than the light extraction rate of the third dimming unit 33, and the light extraction rate of the third dimming unit 33 is greater than the light extraction rate of the second dimming unit 32, so that no obvious light-dark boundaries are located between the first display area 10 and the second display area 20 when the display panel 100 emits light.

Along the direction of the first display area 10 pointing to the second display area 20, the minimum distance $L_2$ between the projection boundary of a third dimming opening of a plurality of third dimming openings 333 along the direction perpendicular to the substrate 1 and the projection boundary of the third pixel opening 213 along the direction perpendicular to the substrate 1 gradually increases. Therefore, when the display panel 100 emits light, no obvious light-dark boundaries are located between the first display area 10 and the second display area 20, and a gradual setting of light emission brightness is realized by a plurality of third dimming units 33 disposed differently.

Figure 16:
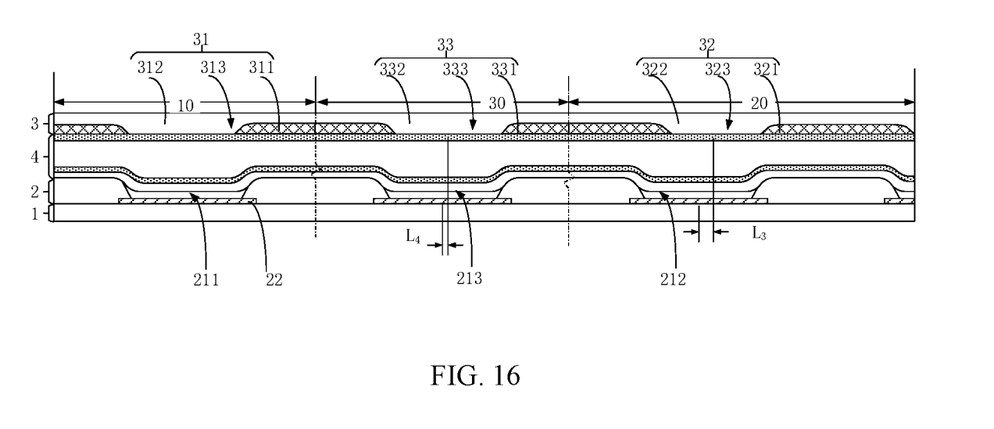
FIG. 16 illustrates another cross-sectional diagram of a display panel consistent with various embodiment of the present disclosure.

Referring to FIG. 16, in other embodiments, the projection center of the second dimming opening 323 along the direction perpendicular to the substrate 1 does overlap the projection center of the second pixel opening 212 along the direction perpendicular to the substrate 1. A minimum distance between the projection center of the second dimming opening 323 along the direction perpendicular to the substrate 1 and the projection center of the second pixel opening 212 along the direction perpendicular to the substrate 1 is $L_3$, and $|L_3| \geq 1$ μm. A principle of the above is like that by changing a size of the second pixel opening 212 and a size of the second dimming opening 323, the light extraction rate of the second dimming unit 32 can be changed. The projection center of the second pixel opening 212 on the substrate 1 overlaps the projection center of the second dimming opening 323 on the substrate 1. Among light emitted by the light emitting unit 22, light emitted within a normal viewing angle range can be emitted directly through the second dimming opening 323, and light emitted at a large angle that is not within the normal viewing angle range is emitted after being adjusted by the second dimming unit 32, to realize that the light originally emitted at a large angle by the light emitting unit 22 is adjusted to light emitted at a normal viewing angle. The projection center of the second pixel opening 212 on the substrate 1 does not overlap the projection center of the second dimming opening 323 on the substrate 1. In the light emitted by the light emitting unit 22, part of the light emitted within the normal viewing angle range can originally be emitted directly through the second dimming opening 323. Since a center of the second pixel opening 212 does not overlap a center of the second dimming opening 323, part of the light emitted within the normal viewing angle range may enter the third refraction section 321 and be adjusted to light emitted at a large angle, so that the light extraction rate of the second dimming unit 32 is lower than the light extraction rate of the first dimming unit 31. The larger a distance between a projection center of the pixel opening and a projection center of the dimming opening on the substrate 1, the lower a corresponding light extraction rate.

When the third dimming unit 33 is disposed, along the direction of the first display area 10 pointing to the second display area 20, the projection of the third dimming opening 333 along the direction perpendicular to the substrate 1 overlaps the projection of the third pixel opening 213 along the direction perpendicular to the substrate 1. A minimum distance between a projection center of the third dimming opening 333 along the direction perpendicular to the substrate 1 and a projection center of the third pixel opening 213 along the direction perpendicular to the substrate 1 is $L_4$, and $0 |L_4| < 1$ That is, by setting the minimum distance between the projection center of the third dimming opening 333 in a direction of the substrate 1 and the projection center of the third pixel opening 213 in the direction of the substrate 1 in the third dimming unit 33, the light extraction rate of the third dimming unit 33 is between the light extraction rates of the first dimming unit 31 and the second dimming unit 32 and no obvious light-dark boundaries are located between the first display area 10 and the second display area 20.

Optionally, along the direction of the first display area 10 pointing to the second display area 20, a minimum distance $L_4$ between a projection center of a third dimming opening of a plurality of third dimming openings 333 along the direction perpendicular to the substrate 1 and the projection center of the third pixel opening 213 along the direction perpendicular to the substrate 1 gradually increases. Therefore, when the display panel 100 emits light, the first display area 10 and the second display area 20 have no obvious light-dark boundaries, and a gradual setting of light emission brightness is realized by a plurality of third dimming units 33 disposed differently.

Figure 17:
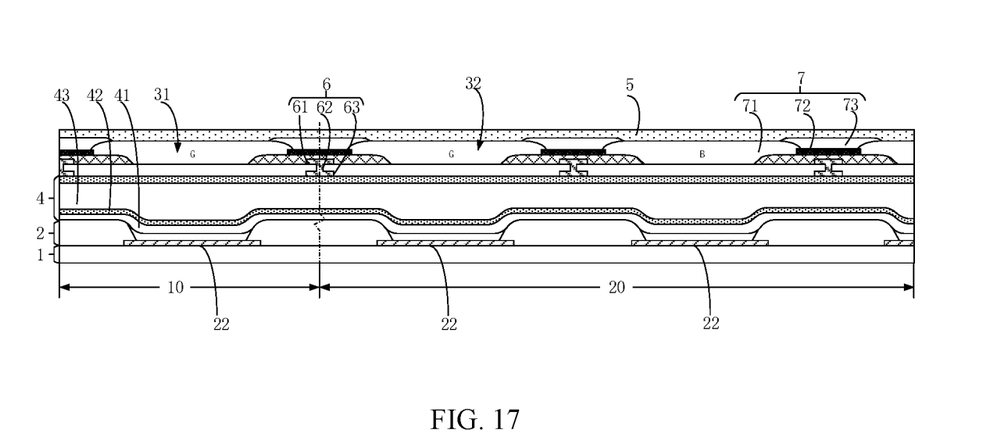
FIG. 17 illustrates another cross-sectional diagram of a display panel consistent with various embodiment of the present disclosure.

Referring to FIG. 17, in some embodiments, the display panel 100 may further include an encapsulation layer 4 between the light emitting device layer 2 and the first refraction section 311. The encapsulation layer 4 covers the light emitting device layer 2 to protect a plurality of light emitting units 22 included in the light emitting device layer 2. The encapsulation layer 4 may include a first inorganic encapsulation layer 41, an organic encapsulation layer 42 and a second inorganic encapsulation layer 43. In some embodiments, the display panel 100 may further include a touch layer 6 for receiving a user's touch operation on the display panel 100. The touch layer 6 includes a plurality of touch metal electrodes 61 for sensing touch input. The touch layer 6 may be located between the encapsulation layer 4 and the first refraction section 311. The touch layer 6 may include a first touch insulation layer 62 and a second touch insulation layer 63. The first touch insulation layer 62 can reuse the first refraction section 311, and the second touch insulation layer 63 can reuse the second refraction section 312, thereby increasing a light emitting effect of the display panel 100 and reducing an overall thickness of the display panel 100. In addition, the multiplexing of the touch layer 6 can also reduce a distance between the light emitting device layer 2 and the dimming layer 3, improve a light extraction efficiency, further enhance a light emitting effect, and improve a light emission brightness. Only the second touch insulation layer 63 may reuse the first refraction section 311 to reduce an overall thickness of the display panel 100.

In some embodiments, the display panel 100 may further include a filter layer 7 for reducing a light reflection of ambient light on the display panel 100 to effectively resist an interference of the ambient light on a display brightness and a display contrast of the display panel 100. The filter layer 7 may be on the second refracting part 312. The filter layer 7 may include a first color filter layer 71 and a black matrix layer 72. Thicknesses and widths of the first color filter layer 71 and the black matrix layer 72 are not limited herein if a projection of the first color filter layer 71 on the substrate 1 covers a projection of the light emitting unit 22 on the substrate 1, and a projection of the black matrix layer 72 on the substrate 1 does not overlap a projection of the light emitting unit 22 on the substrate 1. The filter layer 7 can reuse the second refraction section 312, the fourth refraction section 322, and the sixth refraction section 332, thereby increasing a light emitting effect of the display panel 100 and reducing an overall thickness of the display panel 100. The projection of the black matrix layer 72 on the substrate 1 overlaps a projection of the touch metal electrode 61 on the substrate 1, so that the black matrix layer 72 can shield the touch metal electrode 61, and at a same time, the black matrix layer 72 can also shield all or part of a flat interface between the first refractive section 311 and the second refractive section 312. The flat interface can be regarded as an interface with the slope angle of 0°. The flat interface may increase a light reflectivity of a dimming unit, thereby increasing an overall reflectivity of the display panel. Therefore, by shielding all or part of the flat interface by the black matrix layer 72, a reflectivity of the panel can be reduced on the basis of improving a light extraction efficiency, and an overall quality of the display panel can be improved.

In some embodiments, the filter layer 7 further includes a second color filter layer 73 disposed on a side of the black matrix layer 72 away from the substrate 1 to further reduce a light reflection of the ambient light on the display panel 100. Optionally, a projection of the second color filter layer 73 on the substrate 1 overlaps the projection of the black matrix layer 72 on the substrate 1. The second color filter layer 73 is a red color resist or a blue color resist. Taking a formation of the first dimming unit 31 as an example, the touch layer 6 can be formed on the encapsulation layer 4 first, then the first refraction section 311 and the second refraction section 312 are formed, and finally the black matrix layer 72 and the second color filter layer 73 are formed, thereby improving a forming efficiency.

One embodiment of the present disclosure also provides a display device including the display panel 100 described in any of the above embodiments.

Figure 18:
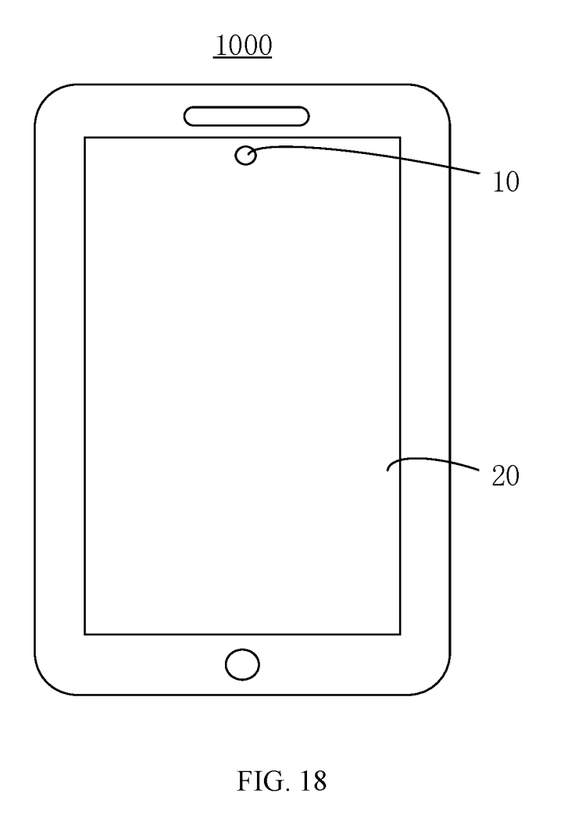
FIG. 18 illustrates a planar structure diagram of a display device consistent with various embodiment of the present disclosure.

FIG. 18 illustrates a planar structure diagram of a display device consistent with various embodiment of the present disclosure. A display device 1000 includes a display panel 100 described in any of the above embodiments. The display device 1000 can be a mobile phone, a computer, a TV, a car display device, and other display device with display functions, which is not limited herein. The display device 1000 has beneficial effects of the display panel 100. Reference may be made to specific descriptions of the display panel 100 in the above embodiments for details, which is not repeated herein.

In addition, the term "and/or" in the present specification is only an association relationship to describe associated objects, representing that three relationships may exist. For example, A and/or B may represent three cases: only A exists, both A and B coexist, and only B exists. In addition, a symbol "/" in the present specification generally indicates that the associated objects before and after the symbol "/" are in an "or" relationship.

In the embodiments of the present disclosure, "B corresponding to A" means that B is associated with A, and B can be determined according to A. It should also be understood that a determination of B according to A does not mean that B is determined only according to A, and B can also be determined according to A and/or other information.

Compared with existing technologies, in the display panel and the display device provided by the embodiments of the present disclosure, by setting the light transmittance of the first display area to be greater than the light transmittance of the second display area, the photosensitive element is more suitable to be disposed on a side of the first display area other than on a side of the second display area. By setting the first dimming opening to correspond to the first pixel opening and setting the refractive index $n_1$ of the first refraction section to be smaller than the refractive index $n_2$ of the second refraction section, the first dimming unit can adjust light emitted from the light emitting unit at a large angle to light emitted at a normal viewing angle, thereby improving a light emitting effect of the first display area.

The above implementations are only specific implementations of the present disclosure, which are not used to limit a protection scope of the present disclosure. A person skilled in the art can easily think of various equivalent modifications or replacements within a technical scope disclosed in the present disclosure. The modifications or replacements shall be covered within the protection scope of the present disclosure. Therefore, the protection scope of the present disclosure shall be subject to the protection scope of the claims.

What is claimed is:

1. A display panel, comprising a first display area and a second display area, a light transmittance of the first display area being greater than a light transmittance of the second display area, wherein the display panel comprises:
   a substrate;
   a light emitting device layer, disposed on a side of the substrate, wherein the light emitting device layer comprises a pixel defining layer with a plurality of pixel openings and a plurality of light emitting units disposed in the plurality of pixel openings; and
   a dimming layer, comprising at least one first dimming unit in the first display area, wherein the at least one first dimming unit comprises a first refraction section on a side of the light emitting device layer away from the substrate and a second refraction section covering the first refraction section on a side away from the substrate, a refractive index $n_1$ of the first refraction section is smaller than a refractive index $n_2$ of the second refraction section, the first refraction section comprises a first dimming opening corresponding to a first pixel opening in the first display area, and a projection of the first dimming opening along a direction perpendicular to the substrate overlaps a projection of the first pixel opening along the direction perpendicular to the substrate,
   wherein the dimming layer further comprises at least one second dimming unit in the second display area, the at least one second dimming unit comprises a third refraction section on the side of the light emitting device layer away from the substrate and a fourth refraction section covering the third refraction section on the side away from the substrate, a refractive index $n_3$ of the third refraction section is smaller than a refractive index $n_4$ of the fourth refraction section, the third refraction section comprises a second dimming opening corresponding to a second pixel opening in the second display area, and a projection of the second dimming opening along the direction perpendicular to the substrate overlaps a projection of the second pixel opening along the direction perpendicular to the substrate, and
   wherein $(n_2-n_1) \geq (n_4-n_3)$.

2. A display panel, comprising a first display area and a second display area, a light transmittance of the first display area being greater than a light transmittance of the second display area, wherein the display panel comprises:
   a substrate;
   a light emitting device layer, disposed on a side of the substrate, wherein the light emitting device layer comprises a pixel defining layer with a plurality of pixel openings and a plurality of light emitting units disposed in the plurality of pixel openings; and
   a dimming layer, comprising at least one first dimming unit in the first display area, wherein the at least one first dimming unit comprises a first refraction section on a side of the light emitting device layer away from the substrate and a second refraction section covering the first refraction section on a side away from the substrate, a refractive index $n_1$ of the first refraction section is smaller than a refractive index $n_2$ of the second refraction section, the first refraction section comprises a first dimming opening corresponding to a first pixel opening in the first display area, and a projection of the first dimming opening along a direction perpendicular to the substrate overlaps a projection of the first pixel opening along the direction perpendicular to the substrate,
   wherein the dimming layer further comprises at least one second dimming unit in the second display area, the at least one second dimming unit comprises a third refraction section on the side of the light emitting device layer away from the substrate and a fourth refraction section covering the third refraction section on the side away from the substrate, a refractive index $n_3$ of the third refraction section is smaller than a refractive index $n_4$ of the fourth refraction section, the third refraction section comprises a second dimming opening corresponding to a second pixel opening in the second display area, and a projection of the second dimming opening along the direction perpendicular to the substrate overlaps a projection of the second pixel opening along the direction perpendicular to the substrate, and
   wherein the dimming layer further comprises at least one third dimming unit on the side of the light emitting device layer away from the substrate, along a direction of the first display area pointing to the second display area, the at least one third dimming unit is disposed between the at least one first dimming unit and the at least one second dimming unit, the at least one third dimming unit comprises a fifth refraction section on the side of the light emitting device layer away from the substrate and a sixth refraction section covering the fifth refraction section on the side away from the substrate, a refractive index ns of the fifth refraction section is smaller than a refractive index no of the sixth refraction section, the fifth refraction section comprises a third dimming opening corresponding to a third pixel opening between the first dimming opening and the second dimming opening along the direction of the first display area pointing to the second display area, a projection of the third dimming opening along the direction perpendicular to the substrate overlaps a projection of the third pixel opening along the direction perpendicular to the substrate, and $(n_2-n_1)>(n_6-n_5)>(n_4-n_3)$.

3. The display panel according to claim 2, wherein the dimming layer at least one third dimming unit comprises a plurality of third dimming units, and a refractive index difference $(n_6-n_5)$ in the plurality of third dimming units gradually decreases.

4. The display panel according to claim 2, wherein at least two of the second refraction section, the fourth refraction section and the sixth refraction section are made of a same material in a same layer.

5. The display panel according to claim 1, wherein along a light emitting direction, a maximum height of the first refraction section is $h_1$, a maximum height of the third refraction section is $h_2$, and $h_1 \geq h_2$.

6. The display panel according to claim 5, wherein the dimming layer comprises at least one third dimming unit on the side of the light emitting device layer away from the substrate, along the direction of the first display area pointing to the second display area, the at least one third dimming unit is disposed between the at least one first dimming unit and the at least one second dimming unit, the at least one third dimming unit comprises a fifth refraction section on the side of the light emitting device layer away from the substrate and a sixth refraction section covering the fifth refraction section on the side away from the substrate, a refractive index ns of the fifth refraction section is smaller than a refractive index no of the sixth refraction section, the fifth refraction section comprises a third dimming opening corresponding to a third pixel opening between the first dimming opening and the second dimming opening along the direction of the first display area pointing to the second display area, a projection of the third dimming opening along the direction perpendicular to the substrate overlaps a projection of the third pixel opening along the direction perpendicular to the substrate, along the light emitting direction, a maximum height of the fifth refraction section is $h_3$, and $h_1 > h_3 > h_2$.

7. The display panel according to claim 6, wherein the at least one third dimming unit comprises a plurality of third dimming units, and along the direction of the first display area pointing to the second display area, the maximum height $h_3$ of the fifth refraction section gradually decreases.

8. The display panel according to claim 5, wherein $h_1 \geq 2.5$ μm, and/or $h_2 \leq 2$ μm.

9. The display panel according to claim 1, wherein the first refraction section comprises a first sidewall, a maximum included angle between the first sidewall and a plane where the substrate is located is $\theta_1$, and $45° \leq \theta_1 \leq 55°$.

10. The display panel according to claim 9, wherein the third refraction section comprises a second sidewall, a maximum included angle between the second sidewall and the plane where the substrate is located is $\theta_2$, and $\theta_2 < 45°$ or $\theta_2 > 55°$.

11. The display panel according to claim 1, wherein a projection center of the second dimming opening along the direction perpendicular to the substrate overlaps a projection center of the second pixel opening along the direction perpendicular to the substrate, a minimum distance between a projection boundary of the second dimming opening along the direction perpendicular to the substrate and a projection boundary of the second pixel opening along the direction perpendicular to the substrate is $L_1$, and $|L_1| \geq 1$ μm.

12. The display panel according to claim 11, wherein the dimming layer comprises at least one third dimming unit on the side of the light emitting device layer away from the substrate, along the direction of the first display area pointing to the second display area, the at least one third dimming unit is disposed between the at least one first dimming unit and the at least one second dimming unit, the at least one third dimming unit comprises a fifth refraction section on the side of the light emitting device layer away from the substrate and a sixth refraction section covering the fifth refraction section on the side away from the substrate, a refractive index ns of the fifth refraction section is smaller than a refractive index no of the sixth refraction section, the fifth refraction section comprises a third dimming opening corresponding to a third pixel opening between the first dimming opening and the second dimming opening along the direction of the first display area pointing to the second display area, a projection of the third dimming opening along the direction perpendicular to the substrate overlaps a projection of the third pixel opening along the direction perpendicular to the substrate, a minimum distance between a projection boundary of the third dimming opening along the direction perpendicular to the substrate and a projection boundary of the third pixel opening along the direction perpendicular to the substrate is $L_2$, and $0 < |L_2| < 1$ μm.

13. The display panel according to claim 12, wherein the at least one third dimming unit comprises a plurality of the third dimming openings along the direction of the first display area pointing to the second display area, the minimum distance $L_2$ between the projection boundary of the third dimming opening along the direction perpendicular to the substrate direction and the projection boundary of the third pixel opening along the direction perpendicular to the substrate direction gradually increases.

14. The display panel according to claim 1, wherein a projection center of the second dimming opening along the direction perpendicular to the substrate does not overlap a projection center of the second pixel opening along the direction perpendicular to the substrate, a minimum distance between the projection center of the second dimming opening along the direction perpendicular to the substrate and the projection center of the second pixel opening along the direction perpendicular to the substrate is $L_3$, and $|L_3| \geq 1$ μm.

15. The display panel according to claim 14, wherein the dimming layer comprises at least one third dimming unit on the side of the light emitting device layer away from the substrate, along the direction of the first display area pointing to the second display area, the at least one third dimming unit is disposed between the at least one first dimming unit and the at least one second dimming unit, the at least one third dimming unit comprises a fifth refraction section on the side of the light emitting device layer away from the substrate and a sixth refraction section covering the fifth refraction section on the side away from the substrate, a refractive index ns of the fifth refraction section is smaller than a refractive index no of the sixth refraction section, the fifth refraction section comprises a third dimming opening corresponding to a third pixel opening between the first dimming opening and the second dimming opening, a projection of the third dimming opening along the direction perpendicular to the substrate overlaps a projection of the third pixel opening along the direction perpendicular to the substrate, a minimum distance between a projection center of the third dimming opening along the direction perpendicular to the substrate and a projection center of the third pixel opening along the direction perpendicular to the substrate is $L_4$, and $0<|L_4|<1$ μm.

16. The display panel according to claim 15, wherein the at least one third dimming unit comprises a plurality of the third dimming openings along the direction of the first display area pointing to the second display area, the minimum distance $L_4$ between the projection center of the third dimming opening along the direction perpendicular to the substrate and the projection center of the third pixel opening along the direction perpendicular to the substrate gradually increases.

17. The display panel according to claim 1, wherein P first dimming units are in a unit area S of the first display area, Q second dimming units are in the unit area S of the second display area, and P>Q.

18. A display device comprising a display panel comprising a first display area and a second display area, a light transmittance of the first display area being greater than a light transmittance of the second display area, wherein the display panel comprises:
a substrate;
a light emitting device layer, disposed on a side of the substrate, wherein the light emitting device layer comprises a pixel defining layer and a plurality of light emitting units, the pixel defining layer comprises a plurality of pixel openings, and the plurality of light emitting units are disposed in the plurality of pixel openings; and
a dimming layer, comprising at least one first dimming unit in the first display area, wherein the at least one first dimming unit comprises a first refraction section on a side of the light emitting device layer away from the substrate and a second refraction section covering the first refraction section on a side away from the substrate, a refractive index $n_1$ of the first refraction section is smaller than a refractive index $n_2$ of the second refraction section, the first refraction section comprises a first dimming opening corresponding to a first pixel opening in the first display area, and a projection of the first dimming opening along a direction perpendicular to the substrate overlaps a projection of the first pixel opening along the direction perpendicular to the substrate,
wherein the dimming layer further comprises at least one second dimming unit in the second display area, the at least one second dimming unit comprises a third refraction section on the side of the light emitting device layer away from the substrate and a fourth refraction section covering the third refraction section on the side away from the substrate, a refractive index $n_3$ of the third refraction section is smaller than a refractive index $n_4$ of the fourth refraction section, the third refraction section comprises a second dimming opening corresponding to a second pixel opening in the second display area, and a projection of the second dimming opening along the direction perpendicular to the substrate overlaps a projection of the second pixel opening along the direction perpendicular to the substrate, and
wherein $(n_2-n_1) \geq (n_4-n_3)$.

\* \* \* \* \*